US009781825B2

(12) United States Patent
Farkas et al.

(10) Patent No.: US 9,781,825 B2
(45) Date of Patent: Oct. 3, 2017

(54) FLEX CIRCUIT, AN INFORMATION HANDLING SYSTEM, AND A METHOD OF MANUFACTURING A FLEXIBLE CIRCUIT

(71) Applicants: Sandor Farkas, Round Rock, TX (US); Girish Kumar Singh, Round Rock, TX (US); Bhyrav M. Mutnury, Round Rock, TX (US)

(72) Inventors: Sandor Farkas, Round Rock, TX (US); Girish Kumar Singh, Round Rock, TX (US); Bhyrav M. Mutnury, Round Rock, TX (US)

(73) Assignee: Dell Products L.P., Round Rock, TX (US)

( * ) Notice: Subject to any disclaimer, the term of this patent is extended or adjusted under 35 U.S.C. 154(b) by 377 days.

(21) Appl. No.: 13/769,592

(22) Filed: Feb. 18, 2013

(65) Prior Publication Data

US 2014/0233165 A1    Aug. 21, 2014

(51) Int. Cl.
*H05K 1/00* (2006.01)
*H05K 1/02* (2006.01)

(52) U.S. Cl.
CPC .......... *H05K 1/028* (2013.01); *H05K 1/0225* (2013.01); *H05K 1/0298* (2013.01); *H05K 2201/051* (2013.01); *H05K 2201/055* (2013.01); *Y10T 156/1026* (2015.01)

(58) Field of Classification Search
CPC ........ H05K 1/093; H05K 1/162; H05K 1/118; H05K 1/189; H01L 2924/01078–2924/01079

USPC .......... 174/254–258; 361/749–750, 793–795
See application file for complete search history.

(56) References Cited

U.S. PATENT DOCUMENTS

| | | | | |
|---|---|---|---|---|
| 6,037,547 A * | 3/2000 | Blish, II | ................ | H05K 1/113 174/264 |
| 6,137,064 A * | 10/2000 | Kiani | ................... | H05K 1/0222 174/261 |
| 6,396,264 B1 * | 5/2002 | Tamaki | ................... | H01P 3/085 324/249 |
| 7,230,328 B2 * | 6/2007 | Hazeyama | .......... | H01L 23/3114 257/685 |
| 8,164,005 B2 * | 4/2012 | Yamashita | ........... | H05K 1/0222 174/250 |
| 2001/0040793 A1 * | 11/2001 | Inaba | .................. | H01L 23/5387 361/749 |
| 2005/0018409 A1 * | 1/2005 | Hirakata | ....................... | 361/752 |
| 2008/0078573 A1 * | 4/2008 | Hu et al. | ....................... | 174/262 |
| 2011/0064369 A1 * | 3/2011 | Furuyama et al. | ........... | 385/129 |
| 2011/0067903 A1 * | 3/2011 | Lin et al. | ..................... | 174/254 |
| 2013/0032381 A1 * | 2/2013 | Hiyama et al. | ............... | 174/254 |

* cited by examiner

*Primary Examiner* — Tuan T Dinh
(74) *Attorney, Agent, or Firm* — Baker Botts L.L.P.

(57) ABSTRACT

A flex circuit including a plurality of layers folded on a first fold line and folded on a second fold line is disclosed. The plurality of layers may include a first conductive layer, an insulating layer adjacent the first conductive layer, and a second conductive layer adjacent the insulating layer. The flex circuit may include a plurality of slits extending through each layer of the plurality of layers, the plurality of slits disposed on the first fold line and the second fold line.

11 Claims, 7 Drawing Sheets

FLEX CIRCUIT, AN INFORMATION HANDLING SYSTEM, AND A METHOD OF MANUFACTURING A FLEXIBLE CIRCUIT

TECHNICAL FIELD

The present disclosure relates generally to information handling systems, and more particularly to micro-strip flex circuits used to connect components in an information handling system.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As space constraints increase, flex circuits may be used instead of heavier, bulkier wire harnesses to provide electrical connections between hardware components in an information handling system. Flex circuits may include one or more layers of, conductive metal foil laminated between flexible layers of an insulating material. Thin layers may be used to promote flexibility and, for most materials, the stiffness of a given layer will increase with thickness.

In addition to being lighter and smaller than wire harnesses or cables, flex circuits may also provide superior electrical and mechanical performance. A further advantage of flex circuits is that a wide range of interfaces may be used to connect a flex circuit to a component of an information handling system. For example, leads may be left bare so that they may slide into board mounted connectors. Additionally, connectors may be soldered or otherwise mechanically affixed directly to the traces within the flex circuit.

SUMMARY

In accordance with one embodiment of the present disclosure, a flex circuit including a plurality of layers folded on a first fold line and folded on a second fold line is disclosed. The plurality of layers may include a first conductive layer, an insulating layer adjacent the first conductive layer, and a second conductive layer adjacent the insulating layer. The flex circuit may include a plurality of slits extending through each layer of the plurality of layers, the plurality of slits disposed on the first fold line and the second fold line.

In accordance with another embodiment of the present disclosure and information handling system is disclosed. The information handling system may include a first information handling component, a second information handling component, and a flex circuit configured to communicatively couple the first information handling component to the second information handling component. The flex circuit may include a plurality of layers folded on a first fold line and folded on a second fold line, and a plurality of slits extending through each layer of the flex circuit, the plurality of slits disposed on the first fold line and the second fold line.

In accordance with yet another embodiment of the present disclosure, a method of manufacturing a flex circuit is disclosed. The method may include forming a plurality of layers including a first conductive layer, an insulating layer adjacent the first conductive layer, and a second conductive layer adjacent the insulating layer. The method may also include forming a plurality of slits extending through each layer of the plurality of layers, the plurality of slits disposed on a first fold line and a second fold line. The method may further include folding the plurality of layers on the first fold line and folding the plurality of layers on the second fold line.

BRIEF DESCRIPTION OF THE DRAWINGS

A more complete understanding of the disclosed embodiments and advantages thereof may be acquired by referring to the following description taken in conjunction with the accompanying drawings, in which like reference numbers indicate like features, and wherein.

DETAILED DESCRIPTION

Figure 1:
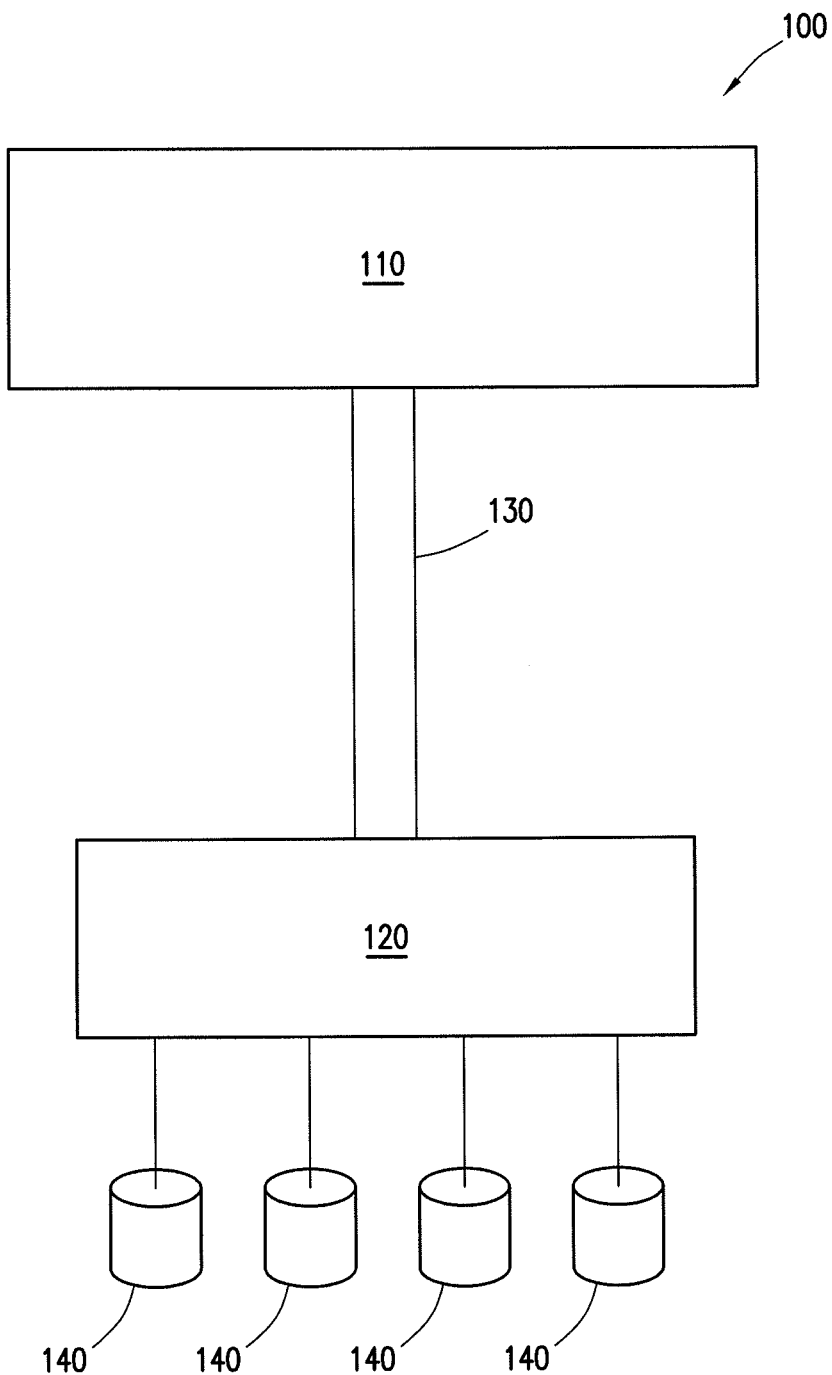
FIG. 1 illustrates an example information handling system in accordance with one embodiment of the present disclosure.

Preferred embodiments and their advantages are best understood by reference to FIGS. 1-7, wherein like numbers are used to indicate like and corresponding parts.

For the purposes of this disclosure, an information handling system may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an information handling system may be a personal computer (e.g., desktop or laptop), tablet computer, mobile device (e.g., personal digital assistant (PDA) or smart phone), server (e.g., blade server or rack server), a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, touchscreen and/or a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

The various components in an information handling system may be connected using, for example, cables, wire harnesses, or flex circuits. A flex circuit may include two conductive layers separated by an insulating layer. One of the conductive layers may be configured to transmit signals, including multiple signal traces, while the other may be configured to serve as a ground for the signal traces in the other conductive layer. For example, a particular flex circuit may include signal traces approximately 4 mils (¹⁄₁₀₀₀th of an inch) wide that are separated from adjacent signal traces by approximately 6 mils. At this width and spacing, however, the electrical interference between adjacent signal traces may be higher than is acceptable for use in applications that use high-speed signal transmission. The electrical interference between adjacent signal traces may be reduced by increasing the spacing between signal traces, but doing so may result in a flex circuit with an overall width too great to permit the flex circuit to fit through designated openings in the chassis of an information handling system. Alternatively, electrical interference between adjacent signal traces may be reduced by providing a ground layer on both sides of the signal traces. This may be accomplished by, for example, adding an additional ground layer such that the signal traces are sandwiched between two conductive layers, each configured to serve as a ground for the signal traces. An increase in the number of layers may, however, result in a significant increase in cost.

In accordance with the teachings of the present disclosure, a flex circuit may be manufactured in which electrical interference may be reduced without increasing the spacing between adjacent signal traces or adding layers to the flex circuit.

FIG. 1 illustrates an example information handling system 100 in accordance with one embodiment of the present disclosure. Information handling system 100 may, in some embodiments, be a blade server, which may include a motherboard 110 communicatively coupled to a backplane 120 via flex circuit 130, and a plurality of disk drives 140. Motherboard 110 may include, among other elements, a memory and a central processing unit. Backplane 120 may include any system, device, or apparatus configured to interconnect with disk drives 140. Flex circuit 130 may be a rolled or folded flex circuit, in accordance with the teachings of the present disclosure. Each disk drive 140 may include computer-readable media (e.g., magnetic storage media, optical storage media, opto-magnetic storage media, and/or other type of rotating storage media, flash memory, and/or other type of solid state storage media) and may be generally operable to store data and/or programs (e.g., one or more operating systems and/or one or more application programs).

As space constraints within blade servers increase, it may be desirable to utilize a rolled or folded flex circuit, which may be narrower than a flat flex circuit of similar electrical performance and thus capable of being routed through narrower openings. Although FIG. 1 depicts a flex circuit used to communicatively couple a motherboard to a backplane, a flex circuit manufactured in accordance with the teachings of the present disclosure may be used to form any board-to-board connection within an information handling system where high-speed signal transmission is desired, such as Peripheral Component Interface Express (PCI-e), Serial Attached SCSI Interface (SAS), and Serial ATA Hard Disk Drive interface signals.

Figure 2:
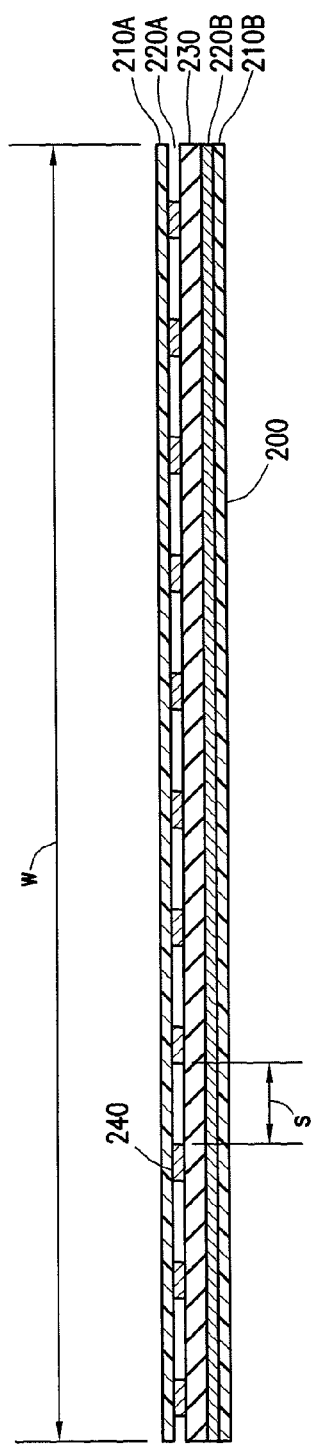
FIG. 2 illustrates a cross-sectional end view of a flex circuit configured to be rolled in accordance with one embodiment of the present disclosure.

FIG. 2 illustrates a cross-sectional end view of an example flex circuit 200 that may be used to electrically connect components in an information handling system in accordance with one embodiment of the present disclosure. Flex circuit 200 may include multiple thin, flexible layers, which may include two conductive layers 220A and 220B separated by an insulating layer 230. Conductive layers 220 may be, for example, a flexible copper, silver, or aluminum foil, or any other suitable material. In some embodiments, one of the two conductive layers 220 may be configured to transmit signals, while the other may be configured to serve as a ground layer. Conductive layer 220A may include signal traces 240, which may be formed by etching conductive layer 220A. Following the etching process, signal traces 240 may be the only portions of conductive layer 220A that remain. Although three signal traces 240 are depicted in FIG. 2, conductive layer 220A may include more than or fewer than three signal traces 240. In the illustrated embodiment, conductive layer 220B may be left intact so that it may serve as a ground (or reference) layer for signal traces 240.

Insulating layer 230 may, for example, be a polyamide or polyester material or any other suitable dielectric material. Conductive layers 220 and insulating layer 230 may be sandwiched between two cover layers 210A and 210B. Like insulating layer 230, cover layers 210 may be a polyamide or polyester material or any other suitable dielectric material. In some embodiments, the layers of flex circuit 200 may be formed individually and bonded to one another using, for example, an adhesive resin. In other embodiments, each layer may be deposited, via direct deposition, onto an adjacent layer as a thin film.

Figure 3:
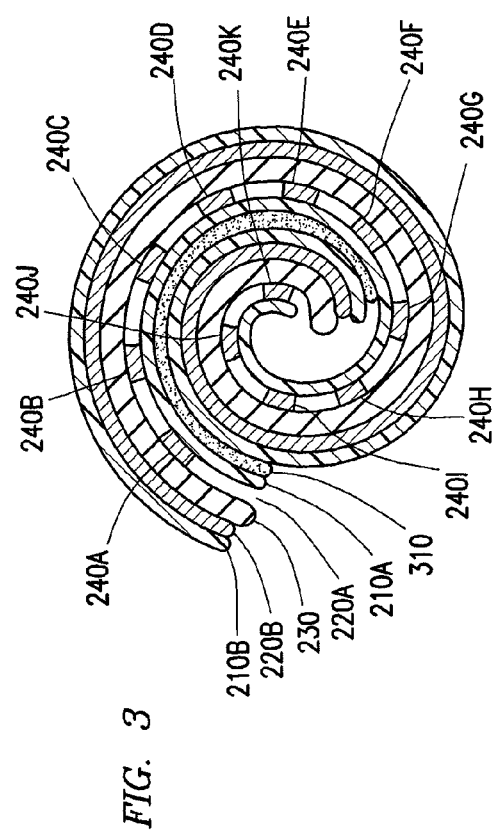
FIG. 3 illustrates cross-sectional end view of a rolled flex circuit in accordance with one embodiment of the present disclosure.

FIG. 3 illustrates a cross-sectional end view of an embodiment in which flex circuit 200 is rolled around itself such that a ground layer may be provided on both sides of a majority of signal traces 240. For example, as flex circuit 200 is rolled, a portion of grounding layer 220B is located on both sides of signal traces 240A-240F, but not signal traces 240G-240K. Rolling flex circuit 200 in this manner provides an additional ground layer for signal traces 240A-240F, which may decrease electrical interference among signal traces 240A-240F without increasing the spacing between signal traces 240 or including additional layers in flex circuit 200. Additionally, rolling flex circuit 200 in this manner may reduce its effective width, thereby permitting the flex circuit 200 to be routed through smaller openings or pathways. Further, rolled flex circuit 200 may be stiffer than a flat or folded flex circuit, which may be advantageous in applications where flex circuit 200 is intended to form a connection that connection must remain more stable and less mobile than a connection formed with a flat or folded flex circuit.

Figure 5:
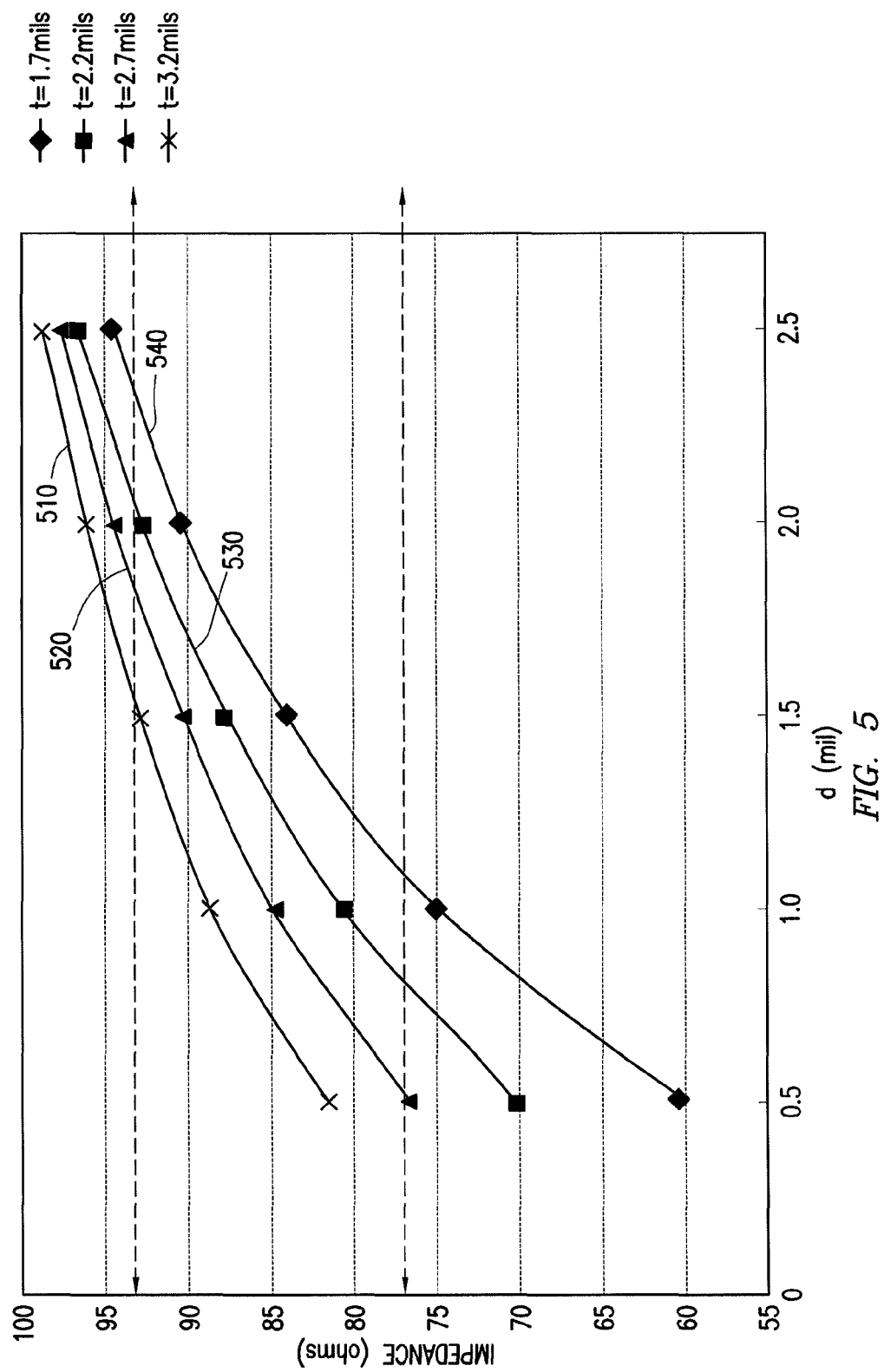
FIG. 5 illustrates a graph of the separation between exterior surfaces of a flex circuit when rolled or folded versus impedance of the flex circuit, in accordance with the teachings of the present disclosure.

Before rolling flex circuit 200, an adhesive material 310 may be applied to cover layer 210A. Adhesive material 310 may, for example, be an adhesive tape. When flex circuit 200 is rolled, the surfaces (e.g., cover layers 470A and 470B) may be separated by distance, which may correspond to the approximate thickness of adhesive material 310. As the thickness of adhesive material 310, and thus the distance, increases, the impedance of flex circuit 200 may also increase. FIG. 5, which is discussed in detail below, illustrates the affect of the distance separating the surface of a rolled or folded flex circuit on the impedance of the flex circuit. As flex circuit 200 is rolled, adhesive material 310 may adhere to cover layer 210B, thereby securing flex circuit 200 in the rolled position shown in FIG. 3.

Figure 4A:
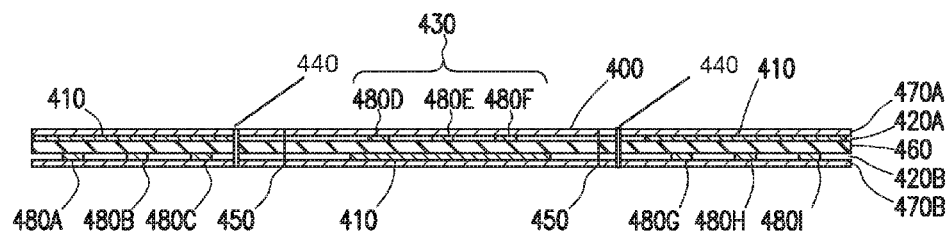
FIG. 4A illustrates a cross-sectional end view of a flex circuit configured to be folded in accordance with another embodiment of the present disclosure.

FIG. 4A illustrates a cross-sectional end view of a flex circuit 400 configured to be folded in accordance with the teachings of the present disclosure. Flex circuit 400 may include two conductive layers 420A and 420B separated by insulating layer 460. Conductive layers 420 and insulating layer 460 may be sandwiched between two cover layers 470A and 470B. Conductive layers 420 may, for example, be a flexible copper, silver, or aluminum foil, or any other flexible, conductive material. Insulating layer 460 may, for example, be a polyamide or polyester material or any other suitable dielectric material. Conductive layers 420 and insulating layer 460 may be sandwiched between two cover layers 470A and 470B. Like insulating layer 460, cover layers 470 may be a polyamide or polyester material or any other suitable dielectric material. In some embodiments, the layers of flex circuit 400 may be formed individually and bonded to one another using, for example, an adhesive resin. In other embodiments, each layer may be deposited, via direct deposition, onto an adjacent layer as a thin film.

Instead of each conductive layer being configured as a signal transmission layer or a ground layer, as shown in FIGS. 2 and 3, each conductive layer 420 may include a portion configured to transmit signals and a portion configured to serve as a ground. For example, as shown in FIG. 4A, conductive layer 420A may include two ground portions 410 separated by a signal transmission portion 430. Conductive layer 420B, on the other hand, may include two signal transmission portions 430 separated by a ground portion 410. The signal transmission portions 430 of conductive layers 420 may include signal traces 480. Although each signal transmission portion 430 is depicted in FIG. 4 as including three signal traces 480, each signal transmission portions 430 may include more than or fewer than three signal traces 480.

The division of conductive layers 420 into ground portions 410 and signal transmission portions 430 may depend on the manner in which flex circuit 400 will be folded. As shown in FIG. 4A, each conductive layer 420 of flex circuit 400 may be divided into three portions—two ground portions 410 and a signal transmission portion 430 in the case of conductive layer 420A, and two signal transmission portions 430 and a grounding portion 410 in the case of conductive layer 420B. Dividing flex circuit 400 into thirds in this manner may facilitate folding the circuit 400 in thirds, as shown in FIG. 4C, with fold lines 450 falling approximately on a boundary between a grounding portion 410 and a signal transmission portion 430. Although FIGS. 4A-4C depict a flex circuit configured to be folded in thirds, a flex circuit may be configured to be folded any number of times, with each conductive layer divided into grounding portions and signal transmission portions corresponding to the desired number of folds.

Figure 4B:
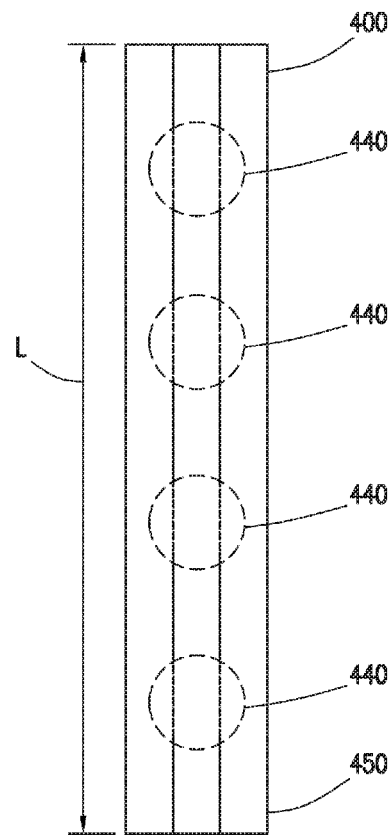
FIG. 4B illustrates a top view of a flex circuit configured to be folded in accordance with one embodiment of the present disclosure.
Figure 4C:
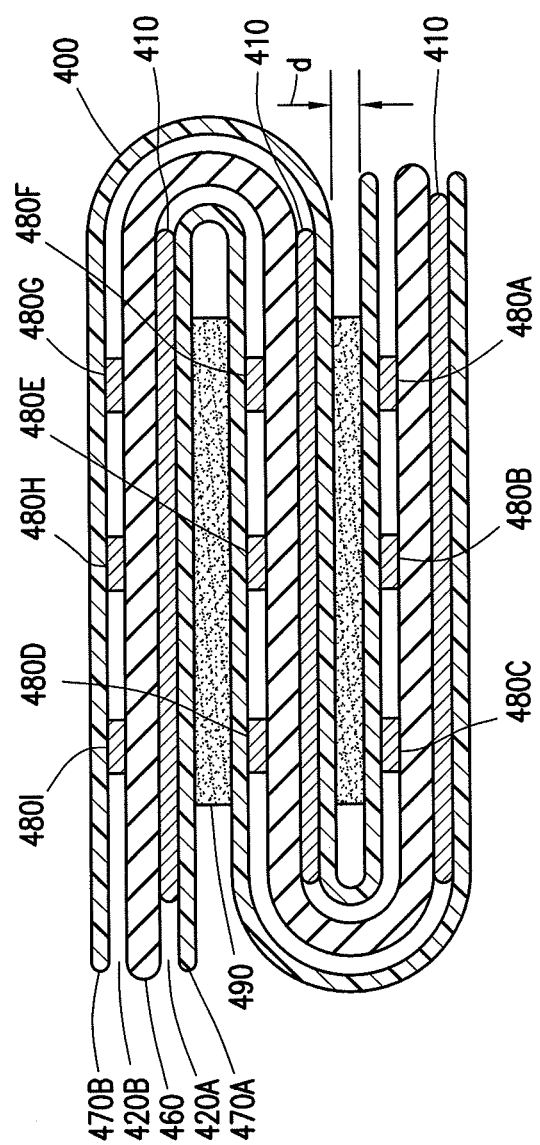
FIG. 4C illustrates a cross-sectional end view of a folded flex circuit in accordance with one embodiment of the present disclosure.

FIG. 4B illustrates a top view of flex circuit 400. To facilitate folding, flex circuit 400 may include a series of slits 440 extending through each layer of flex circuit 400. For example, a series of slits 440 may be placed along the length (L) of flex circuit 400. Slits 440 may be placed on fold lines 450, which may be located or near the boundary between a grounding portion 410 and a signal transmission portion 430. A dashed line illustrating the location of slits 440 is also shown in FIG. 4A, which illustrates a cross-sectional end view of flex circuit 400.

Slits 440 may be created using any suitable cutting mechanism or process. In some embodiments, for example, slits 440 may be formed using a laser cutting mechanism or a steel die. Slits 440 may, in some embodiments, occupy between approximately 10% and approximately 90% of the length (L) of flex circuit 400. In other embodiments, slits 440 may occupy between approximately 15% and approximately 50% of the length (L) of flex circuit 400. In still other embodiments, slits 440 may occupy approximately 25% of the length (L) of flex circuit 400.

FIG. 4C illustrates a cross-sectional end view of flex circuit 400 which may be folded such that a grounding portion 410 is provided on both sides of a majority of signal traces 480 in accordance the teachings of the present disclosure. As shown in FIG. 4C, flex circuit 400 may be folded into a shape approximating the letter "Z" or an upside-down "S." By folding flex circuit 400 in this manner, grounding portion 410 may be located on both sides of signal traces 480A-480F, but not signal traces 480G-480I. By providing a grounding portion 410 on both sides of signal traces 480A-480F, electrical interference among signal traces 480A-480F may be decreased without increasing the spacing between signal traces 240 or including additional layers in flex circuit 400.

Before folding flex circuit 400, an adhesive material 490 may be applied to a first portion of cover layer 470A and a first portion of cover layer 470B. As flex circuit 400 is folded, the adhesive material 490 applied to the first portion of cover layer 470A and the first portion of cover layer 470B may adhere to a second portion of cover layer 470A and a second portion of cover layer 470B, respectively. Adhesive material 490 may thereby secure flex circuit 400 in the folded position shown in FIG. 4C.

When flex circuit 400 is folded, the surfaces (e.g., cover layers 470A and 470B) may be separated by distance (d), shown in FIG. 4C. The distance (d) separating the surfaces of flex circuit 400 may depend on the thickness of adhesive material 490. As the thickness of adhesive material 490, and thus distance (d), increases, the impedance of the flex circuit 400 may also increase.

FIG. 5 illustrates a graph of the separation between the surfaces of a flex circuit when rolled or folded versus impedance of the flex circuit, in accordance with the teachings of the present disclosure. FIG. 5 includes curves 510, 520, 530, and 540, which correspond to flex circuits with cover layers having a thickness (t) of approximately 1.7 mils, 2.2 mils, 2.7 mils, and 3.2 mils, respectively. Each of the flex circuits illustrated by curves 510-540 further include an insulating layer with a thickness of approximately 3 mils. As shown by each of the curves 510-540, the impedance of the flex circuit increases as the distance (d) increases. In some embodiments, an impedance between approximately seventy-seven ohms (77 ohms) and approximately ninety-three ohms (93 ohms) may be desired. In other embodiments, a flex circuit with approximately eighty-five ohms (85 ohms) of impedance may be desired. Thus, a value for distance (d) may be determined based on the thickness (t) of the cover layers and the desired impedance of approximately 85 ohms. In the case of the flex circuit illustrated by curve 520, an impedance of approximately 85 ohms may be achieved if the exterior surfaces of the flex circuit are separated by approximately 1 mil when the flex circuit is folded. Similarly, in the case of the flex circuit illustrated by curve 540, an impedance of approximately 85 ohms may be achieved if the exterior surfaces of the flex circuit are separated by approximately 1.5 mils when the flex circuit is folded.

Figure 6:
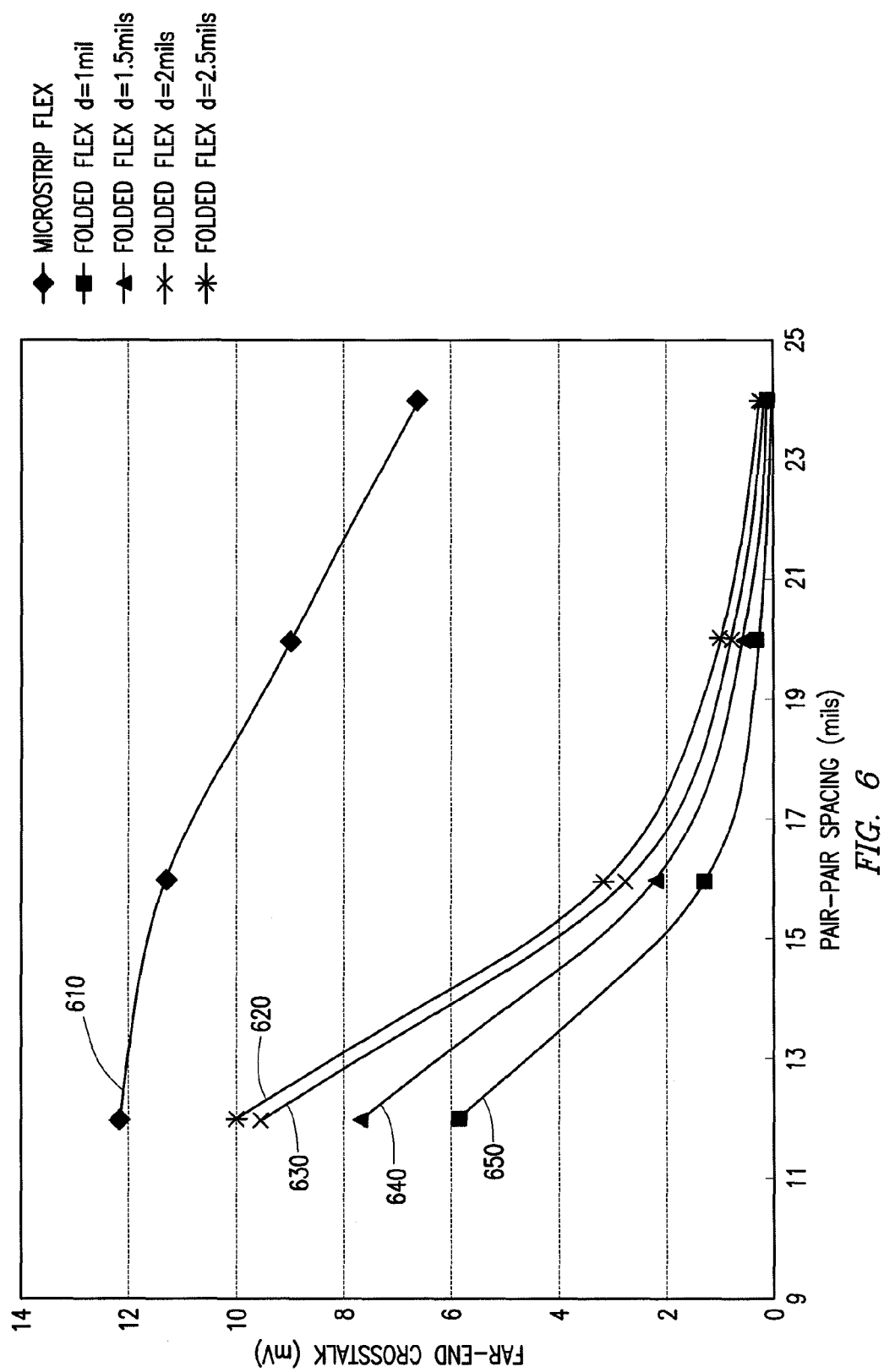
FIG. 6 illustrates a graph of the spacing between adjacent signal traces versus the electrical interference among adjacent signal traces, in accordance with the teachings of the present disclosure.

FIG. 6 illustrates a graph of the spacing between adjacent signal traces versus the electrical interference (which may also be referred to as cross-talk) among adjacent signal traces, in accordance with the teachings of the present disclosure. Curve 610 illustrates a flat flex circuit in which an additional layer has been added to provide a ground on both sides of the signal traces. Curves 620-650, on the other hand, illustrate folded flex circuits similar to flex circuit 400, which was discussed in detail with respect to FIGS. 4A-4C. The flex circuits illustrated by curves 620, 630, 640, and 650 are folded such that the surfaces of the flex circuit are separated by a distance (d) of approximately 1 mil, 1.5 mils, 2 mils, and 2.5 mils, respectively.

Each of the curves 610-650 illustrate that electrical interference among adjacent signal traces increases as the spacing between signal traces decreases. The signal traces in the folded flex circuits illustrated by curves 620-650, however, experience lower levels of electrical interference than those in the flat flex circuit illustrated by curve 610. Thus, a folded flex circuit manufactured in accordance with the teachings of the present disclosure may have higher electrical performance than a flat flex circuit in which an additional layer has been added to provide a ground on both sides of the signal traces.

Additionally, curves 620-650 illustrate that as the distance (d) by which the surfaces of a folded flex circuit are separated decreases, the electrical interference among adjacent signal traces also decreases. Consider, for example, curves 620 and 650. Curve 620 represents a folded flex circuit in which the surfaces are separated by a distance (d) of approximately 2.5 mils, while curve 650 represents a folded flex circuit in which the surfaces are separated by a distance (d) of approximately 1 mil. Up to the point of convergence, the signal traces of the flex circuit represented by curve 650 experience less electrical interference than those of the flex circuit represented by curve 620.

Figure 7:
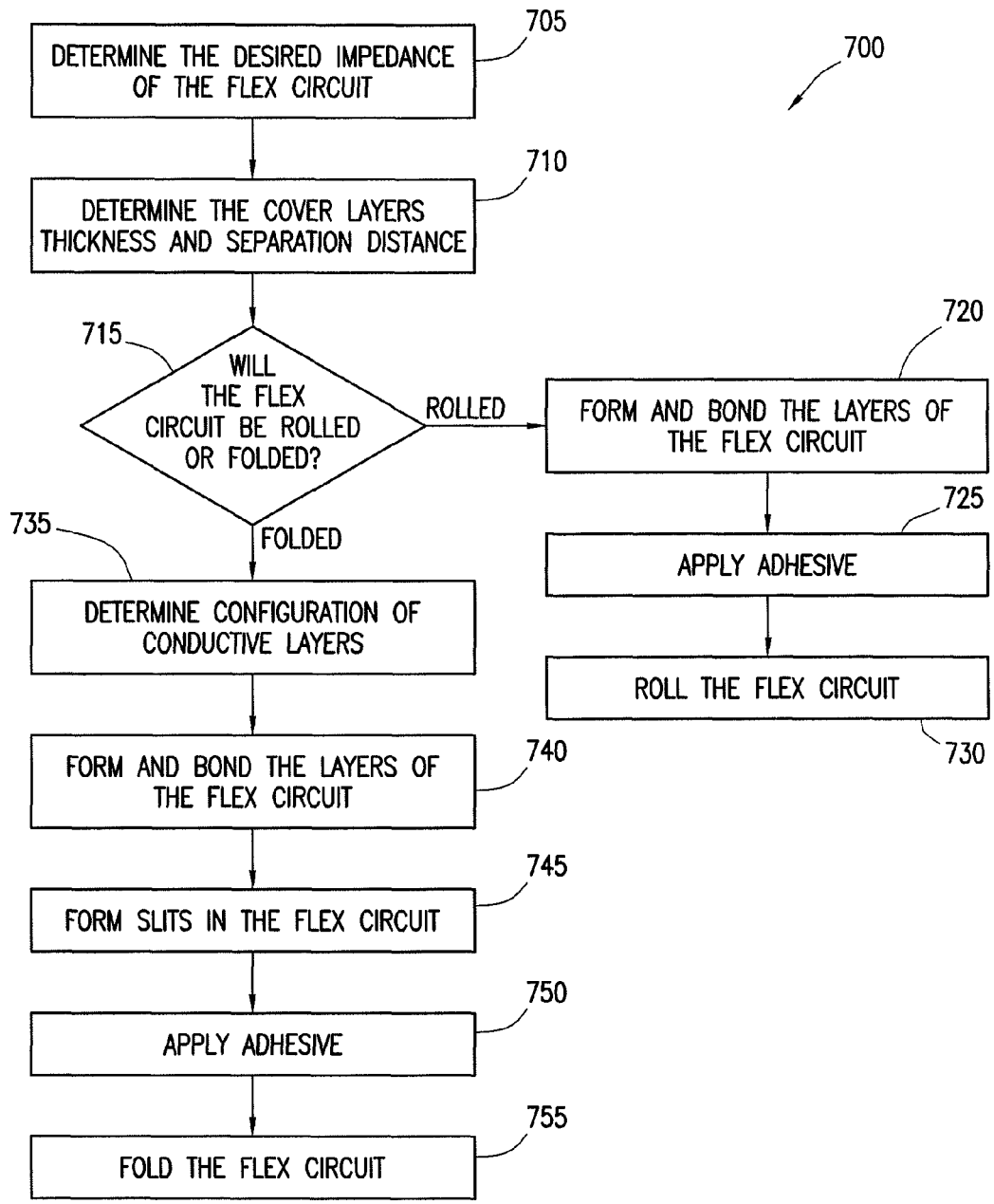
FIG. 7 illustrates an example method of manufacturing a flex circuit in accordance with the teachings of the present disclosure.

FIG. 7 illustrates an example method 700 of manufacturing a flex circuit in accordance with the teachings of the present disclosure. The flex circuit may be rolled or folded to provide a grounding layer on both sides of a majority of the signal traces. Manufacturing a flex circuit according to this method may permit a reduction of electrical interference among adjacent signal traces without increasing the overall width of the flex circuit or the number of layers in the circuit.

At step 705, the desired impedance of the flex circuit may be determined. In the case of a flex circuit used for high-speed signal transmission, an impedance between approximately 75 ohms and approximately 95 ohms may be desired. At step 710, the thickness of the cover layers and the distance by which the exterior surfaces of the flex circuit are separated when rolled or folded may be determined. As discussed above, the impedance of the flex circuit may be affected by the thickness of the cover layers and the distance by which the exterior surfaces of the flex circuit are separated when rolled or folded. Thus, based on the desired impedance of the circuit, both the thickness of the cover layers and the distance by which the exterior surfaces of the flex circuit are separated when rolled or folded may be determined.

Consider, for example the flex circuits represented by the curves in FIG. 5, each of which includes an insulating layer with a thickness of approximately 3 mils. Any of the following combinations of cover layer thickness (t) and exterior surface separation (d) may result in a flex circuit with an impedance of approximately 85 ohms: (1) for the flex circuit represented by curve 540, a cover layer thickness (t) of approximately 1.7 mils and exterior surface separation (d) of approximately 1.5 mils; (2) for the flex circuit represented by curve 530, a cover layer thickness (t) of approximately 2.2 mils and an exterior surface separation (d) of approximately 1.25 mils; (3) for the flex circuit represented by curve 520, a cover layer thickness (t) of approximately 2.7 mils and an exterior surface separation (d) of approximately 1 mil; and (4) for the flex circuit represented by curve 510, a cover layer thickness (t) of approximately 3.2 mils and an exterior surface separation of approximately 0.75 mil.

At step 715, a determination may be made regarding whether the flex circuit will be rolled or folded. If the flex circuit will be rolled, the method may proceed to step 720. If the flex circuit will be folded, the method may proceed to step 735. At step 720, the layers of the flex circuit may be formed and bonded. As discussed above, in some embodiments, a flex circuit may include two conductive layers, an insulating layer, and two cover layers. In the case of a rolled flex circuit (as shown in FIG. 3), one of the conductive layers may be configured for signal transmission and may include signal traces, while the other may be configured as a ground layer. Signal traces may be formed by, for example, removing portions of a conductive layer through etching. In some embodiments, the layers of the flex circuit may be formed individually and bonded to one another using an adhesive. In other embodiments, each layer may be deposited, via direct deposition, onto an adjacent layer as a thin film.

At step 725, adhesive material may be applied to the cover layer adjacent the conductive layer configured as a ground layer. Consider, for example, flex circuit 200, which is shown in FIGS. 2 and 3. Before rolling flex circuit 200, an adhesive material 310 may be applied to cover layer 210A. As flex circuit 200 is rolled, adhesive material 310 may adhere to cover layer 210B, thereby securing flex circuit 200 in the rolled position shown in FIG. 3.

At step 730, the flex circuit may be rolled, leaving the desired separation between the exterior surfaces. As discussed above, the distance separating the surfaces of the flex circuit when rolled or folded may depend on the thickness of the adhesive material. As the flex circuit is rolled, the adhesive material applied at step 725 may adhere to the other cover layer, thereby securing the flex circuit in the rolled position.

If it is determined that the flex circuit will be folded instead of rolled, the method may proceed to step 735. At step 735, a determination may be made regarding which portions of the conductive layers of the flex circuit will be configured for signal transmission and which portions will be configured for grounding. As discussed in conjunction with FIGS. 4A-4B, each conductive layer may include a portion configured for signal transmission and a portion configured for grounding. The signal transmission portion of the conductive layers may include signal traces, which may be formed by etching the conductive layers.

The division of conductive layers into grounding portions and signal transmission portions may depend on the manner in which flex circuit will be folded. For example, the flex circuit discussed in connection with FIGS. 4A-4C was folded in thirds along fold lines 450; thus the conductive layers were divided into three portions—two grounding portions and a signal transmission portion on one layer, and two signal transmission portions and a grounding portion on the other.

At step 740, the layers of the flex circuit may be formed and bonded. As discussed above, in some embodiments, a flex circuit may include two conductive layers, an insulating layer, and two cover layers. In the case of a folded flex circuit (as shown in FIGS. 4A-4C), a portion of each conductive layer may be configured for signal transmission and a portion may be configured for grounding. In the portion configured for signal transmission, signal traces may be formed by, for example, removing portions of a conductive layer through etching. In some embodiments, the layers of flex circuit 100 may be formed individually and bonded to one another using, for example, an adhesive resin. In other embodiments, each layer may be deposited, via direct deposition, onto an adjacent layer as a thin film.

At step 745, one or more slits may be formed in the flex circuit to facilitate folding. As discussed above with respect to FIG. 4B, the one or more slits may be located on or near fold lines 450, which may be located on or near a boundary between a grounding portion and a signal transmission portion. The slits may be formed using any suitable cutting mechanism or process and, in some embodiments, may occupy between approximately 10% and approximately 90% of the length of the flex circuit. In other embodiments, the slits may occupy between approximately 15% and approximately 50% of the length of the flex circuit. In still other embodiments, the slits may occupy approximately 25% of the length of the flex circuit.

At step 750, adhesive material may be applied to portions of both cover layers, as shown in FIG. 4B. At step 755, the flex circuit may be folded, leaving the desired separation between the exterior surfaces. As discussed above, the distance separating the surfaces of the flex circuit when rolled or folded may depend on the thickness of the adhesive material. The flex circuit may naturally tend to fold along the lines where the slits were created. As the flex circuit is folded, the adhesive material may adhere to exposed portions of the cover layers, thereby securing the flex circuit in the folded position.

Although the present disclosure has been described in detail, it should be understood that various changes, substitutions, and alterations can be made hereto without departing from the spirit and the scope of the disclosure as defined by the appended claims.

What is claimed is:

1. A flex circuit, comprising:
   a plurality of layers folded on a first fold line and folded on a second fold line, the plurality of layers including:
   a first conductive layer including a first signal transmission portion parallel to the first fold line and a first ground portion;
   an insulating layer adjacent the first conductive layer;
   a second conductive layer adjacent the insulating layer including a second signal transmission portion parallel to the second fold line and a second ground portion; and
   a plurality of slits extending through each layer of the plurality of layers, the plurality of slits disposed on the first fold line and the second fold line;
   wherein the plurality of layers are folded such that a first portion of the insulating layer is located on a first plane, and a second portion of the insulating layer is located on a second plane parallel to the first plane;
   wherein the plurality of layers further comprise:
   a first cover layer adjacent the first conductive layer; and
   a second cover layer adjacent the second conductive layer; and
   wherein the plurality of slits comprises:
   a first set of slits formed on the first fold line, the first set of slits occupying greater than approximately 10% of a total length of the first fold line; and
   a second set of slits formed on the second fold line; the second set of slits occupying greater than approximately 10% of a total length of the second fold line.

2. The flex circuit of claim 1, wherein:
   a first portion of the first cover layer is separated from a second portion of the first cover layer by a distance, the first cover layer folded on the first fold line such that the first portion and the second portion of the first cover layer are adjacent one another; and
   a first portion of the second cover layer is separated from a second portion of the second cover layer by the distance, the second cover layer folded on the second fold line such that the first portion and the second portion of the second cover layer are adjacent one another.

3. The flex circuit of claim 1, further comprising:
   a first adhesive material disposed on a first portion of the first cover layer and configured to adhere to a second portion of the first cover layer, the first cover layer folded on the first fold line such that the first portion and the second portion of the first cover layer are adjacent one another; and
   a second adhesive material disposed on to a first portion of the second cover layer and configured to adhere to a second portion of the second cover layer, the second cover layer folded on the second fold line such that the first portion and the second portion of the second cover layer are adjacent one another.

4. The flex circuit of claim 1, wherein the distance corresponds to a desired impedance the plurality of layers.

5. An information handling system comprising:
   a first information handling component;
   a second information handling component; and a flex circuit configured to communicatively couple the first information handling component to the second information handling component, the flex circuit including:

a plurality of layers including:

a first conductive layer including a first signal transmission portion and a first ground portion; and a second conductive layer including a second ground portion and a second signal transmission portion;

the plurality of layers folded on a first fold line parallel to the first signal transmission portion and folded on a second fold line parallel to the second signal transmission portion; and a plurality of slits extending through each layer of the flex circuit, the plurality of slits disposed on the first fold line and the second fold line;

wherein the plurality of layers are folded such that a first portion of one layer of the plurality of layers is located on a first plane, and a second portion of the one layer of the plurality of layers is located on a second plane parallel to the first plane;

the plurality of layers further comprising:

a first cover layer adjacent the first conductive layer;

an insulating layer adjacent the first conductive layer and adjacent the second conductive layer; and a second cover layer adjacent the second conductive layer; and wherein the plurality of slits comprises:

a first set of slits formed on the first fold line, the first set of slits occupying greater than approximately 10% of a total length of the first fold line; and a second set of slits formed on the second fold line; the second set of slits occupying greater than approximately 10% of a total length of the second fold line.

6. The information handling system of claim 5, the flex circuit further comprising:

a first adhesive material piece disposed on a first portion of a first cover layer of the plurality of layers and configured to adhere to a second portion of the first cover layer, the first cover layer folded on the first fold line such that the first portion and the second portion of the first cover layer are adjacent one another; and a second adhesive material piece disposed on a first portion of a second cover layer of the plurality of layers and configured to adhere to a second portion of the second cover layer, the second cover layer folded on the second fold line such that the first portion and the second portion of the second cover layer are adjacent one another.

7. The information handling system of claim 5, wherein:

a first portion of a first cover layer of the plurality of layers is separated from a second portion of the first cover layer by a distance, the first cover layer folded on the first fold line such that the first portion and the second portion of the first cover layer are adjacent one another; and a first portion of a second cover layer of the plurality of layers is separated from a second portion of the second cover layer by the distance, the second cover layer folded on the second fold line such that the first portion and the second portion of the second cover layer are adjacent one another.

8. The information handling system of claim 7, wherein the distance is selected based on a desired impedance of the plurality of layers.

9. A method of manufacturing a flex circuit, comprising:

forming a plurality of layers the plurality of layers including:

a first conductive layer including a first set of signal traces and a first ground portion;

an insulating layer adjacent the first conductive layer; and a second conductive layer adjacent the insulating layer including a second set of signal traces and a second ground portion;

forming a plurality of slits extending through each layer of the plurality of layers, the plurality of slits disposed on a first fold line parallel to the first set of signal traces and a second fold line parallel to the second set of signal traces: folding the plurality of layers on the first fold line; and folding the plurality of layers on the second fold line;

wherein the plurality of layers are folded such that a first portion of the insulating layer is located on a first plane, and a second portion of the insulating layer is located on a second plane parallel to the first plane;

wherein the plurality of layers comprises: a first cover layer adjacent the first conductive layer; and a second cover layer adjacent the second conductive layer; and wherein the plurality of slits comprises:

a first set of slits disposed on the first fold line, the first set of slits occupying greater than approximately 10% of a total length of the first fold line; and a second set of slits disposed on the second fold line; the second set of slits occupying greater than approximately 10% of a total length of the second fold line.

10. The method of claim 9, further comprising:

applying a first adhesive material to a first portion of the first cover layer, the first adhesive material configured to adhere to a second portion of the first cover layer, the first cover layer folded on the first fold line such that the first portion and the second portion of the first cover layer are adjacent one another; and applying a second adhesive material to a first portion of the second cover layer, the second adhesive material configured to adhere to a second portion of the second cover layer, the second cover layer folded on the second fold line such that the first portion and the second portion of the second cover layer are adjacent one another.

11. The method of claim 9, further comprising:

determining a desired impedance of the plurality of layers;

determining, based on the desired impedance, a particular distance by which adjacent surfaces of the plurality of layers are separated when folded.

* * * * *